(12) United States Patent
Plourde

(10) Patent No.: US 12,069,966 B2
(45) Date of Patent: Aug. 20, 2024

(54) SUPERCONDUCTING METAMATERIALS FOR QUANTUM SIMULATIONS AND QUBIT ADDRESSABILITY IN QUANTUM PROCESSORS

(71) Applicant: Britton Plourde, Jamesville, NY (US)

(72) Inventor: Britton Plourde, Jamesville, NY (US)

(73) Assignee: SYRACUSE UNIVERSITY, Syracuse, NY (US)

( * ) Notice: Subject to any disclaimer, the term of this patent is extended or adjusted under 35 U.S.C. 154(b) by 435 days.

(21) Appl. No.: 17/545,592

(22) Filed: Dec. 8, 2021

(65) Prior Publication Data

US 2022/0181534 A1 Jun. 9, 2022

Related U.S. Application Data

(60) Provisional application No. 63/122,691, filed on Dec. 8, 2020.

(51) Int. Cl.
| | |
|---|---|
| *H01L 39/02* | (2006.01) |
| *G06N 10/00* | (2022.01) |
| *H10N 60/80* | (2023.01) |
| *H10N 60/85* | (2023.01) |

(52) U.S. Cl.
CPC ........... *H10N 60/805* (2023.02); *G06N 10/00* (2019.01); *H10N 60/85* (2023.02)

(58) Field of Classification Search
CPC ...... H10N 60/805; H10N 60/85; H10N 69/00; G06N 10/00; G06N 10/40
See application file for complete search history.

(56) References Cited

U.S. PATENT DOCUMENTS

| | | | |
|---|---|---|---|
| 2017/0076787 A1* | 3/2017 | Frank | G06N 10/00 |
| 2022/0156620 A1* | 5/2022 | McDermott, III | H03K 19/195 |

* cited by examiner

*Primary Examiner* — Mohammed R Alam
(74) *Attorney, Agent, or Firm* — David L. Nocilly; Bond, Schoeneck & King PLLC

(57) ABSTRACT

Superconducting metamaterials composed of lumped-element inductors and capacitors are used to implement microwave photonics with novel dispersion relations and dense mode spectra that can be coupled to qubits. Metamaterial lattices may have qubits coupled to different unit cells in the metamaterial such that each qubit will couple strongly to modes with an antinode at the qubit location. Through simultaneous driving of combinations of modes, large amplitudes are produced at only one or a few unit cells, resulting in large ac Stark shifts of qubits located there, and providing a frequency-addressable qubit array without requiring flux-tunability and with reduced control wiring.

8 Claims, 11 Drawing Sheets

SUPERCONDUCTING METAMATERIALS FOR QUANTUM SIMULATIONS AND QUBIT ADDRESSABILITY IN QUANTUM PROCESSORS

CROSS-REFERENCE TO REPLATED APPLICATIONS

The present application claims priority to U.S. Provisional No. 63/122,691 filed on Dec. 8, 2020.

BACKGROUND OF THE INVENTION

1. Field of the Invention

The present invention relates to quantum computers and, more specifically, to superconducting quantum metamaterial schemes for scalable quantum simulators and processors.

2. DESCRIPTION OF THE RELATED ART

While there have been tremendous recent advances building small-scale quantum processors using superconducting circuits, there are significant challenges associated with scaling to larger arrays. In particular, the requirement of multiple control and readout lines for each qubit and the concomitant heat load with bringing these lines into the low temperature environment severely limit array sizes.

Superconducting qubits are one of the most promising platforms for implementing quantum processors and there have been significant advances in this direction in research years, both in the academic research community and the industrial quantum computing arena. At the same time, there are many outstanding fundamental research challenges associated with scaling to a fully error-corrected large-scale universal quantum processor. Even without full error correction, the current era of Noisy Intermediate Scale Quantum (NISQ) devices offers unique opportunities for implementing systems with the potential for solving important problems more efficiently than is possible classically. There are also opportunities for developing new approaches using superconducting electronics and microwave photonics for implementing scalable solutions to quantum simulation and computing. The implementation of quantum processors and simulators may impact such areas as materials discovery and design and information security.

One of the key obstacles associated with current state-of-the-art implementations of quantum information processors and quantum simulators with superconducting circuits involves the connectivity required for qubit control and readout and the associated poor scaling properties. In a typical qubit lattice, each qubit requires one independent Z-control line and a separate X/Y-control line. In addition, each qubit typically has a dedicated readout resonator for detecting the qubit state. Thus, for scaling to large arrays, one requires a significant number of connections onto the chip that is at least a few times the number of qubits; each of these lines must be routed in or out of the low-temperature environment, which puts a significant strain on the cryostat operation.

Quantum simulations of classically hard problems are one of the most promising potential near-term application of NISQ systems, where a fully error corrected quantum processor is not necessary. Quantum walks are a particularly attractive type of simulation because of the ability to map quantum computing and various hard optimization problems onto quantum walks. A quantum walk has some similarity to a classical random walk, but with quantum coherence and thus the possibility for large-scale quantum interference. The particles undergoing a quantum walk have some probability to move between the simulation lattice based on the nature of their superposition state and the tunnel couplings between lattice sites. Initial work in the implementation of quantum walks has involved integrated photonics, where photons tunnel between adjacent waveguides. Schemes for implementing quantum walks in circuit Quantum Electrodynamics (cQED) that have been implemented so far have involved 1D lattices of superconducting transmon qubits with nearest-neighbor capacitive coupling. In this scheme, the objects that undergo the quantum walk are qubit excitations that can hop between qubit lattice sites with a strength determined by the qubit-qubit coupling capacitors. This state-of-the-art approach poses significant scaling challenges due to the control and readout requirements for each qubit. In order to build more lattice sites, one must add qubits along with control and readout lines, thus limiting the lattice size for such a cQED approach.

While a modern semiconductor processor chip contains several billion transistors, the number of leads connecting the chip to the processor board is vastly smaller. The related wiring scaling, described by Rent's Rule in the case of semiconductor ICs, has overwhelmingly worse properties for current state-of-the-art quantum processors, where multiple connections are required per qubit for control and readout. This poses a substantial challenge to scaling much beyond the current state-of-the-art devices Superconducting metamaterials provide a novel and potentially paradigm-shifting route for tackling these challenges. Accordingly, there is a need in the art for an approach that uses metamaterials to implement a large number of microwave photonic modes in a narrow frequency range with a compact physical footprint.

BRIEF SUMMARY OF THE INVENTION

The present invention provides a quantum circuit architecture that can implement a large number of modes in a compact footprint by providing for frequency specific addressing of transmon qubits. More specifically, the present invention is a quantum circuit formed from a plurality of lumped-element inductors and a plurality of lumped-element capacitors formed from a superconducting metamaterial, wherein the plurality of lumped-element inductors and the plurality of lumped-element capacitors are configured as a plurality of unit cells arranged in a lattice. A series of superconducting qubits are embedded in the lattice by coupling each of the series of superconducting qubits to a different one of the plurality of unit cells of the lattice. Each of the series of superconducting qubits is individually addressable by using one of a combination of metamaterial modes that will generate a Stark shift of a transition frequency of that superconducting qubit. A high-bandwidth arbitrary waveform generator may be coupled to the lattice and configured to selectively drive the combination of metamaterial modes and generate the Stark shift of the transition frequency of one of more of the series of superconducting qubits. The circuit may include a readout resonator coupled to each superconducting qubit. Each unit cell of the two dimensional lattice may be formed from a first inductor and a second capacitor coupled in series, a second inductor and a second capacitor coupled in parallel, and third inductor and third capacitor coupled in series. The lattice may be two dimensional.

The present invention also include a method of forming a quantum circuit by arranging a plurality of lumped-element inductors and a plurality of lumped-element capacitors formed from a superconducting metamaterial as a plurality of unit cells arranged in a two dimensional lattice and then coupling each of a series of superconducting qubits to a different one of the plurality of unit cells of the lattice so that each of the series of superconducting qubits is individually addressable using a different single frequency or a different combination of frequencies. The method may further include coupling a high-bandwidth arbitrary waveform generator coupled to the two dimensional lattice and then using the high-bandwidth arbitrary waveform generator to selectively drive the combination of metamaterial modes and generate the Stark shift of the transition frequency of one or more of the series of superconducting qubits.

The present invention thus takes advantage of superconducting metamaterials to form transmission lines and lattices from chains of lumped-element inductors and capacitors to gain control over the band structure and dispersion relations, and, in particular, make left-handed systems where the mode frequency is a falling function of wavenumber. Such left-handedness allows for a large number of orthogonal microwave photonic modes, which are capable of interacting strongly with qubits, to be compressed into a narrow frequency window. When the qubits are biased in the metamaterial bandgap, their coherence can be long, in contrast to the enhanced loss when a qubit is biased on resonance with one of the modes. At the same time, the qubits still interact with the metamaterial modes dispersively and parametric modulation of each qubit's transition at the sideband difference frequency between the qubit and a metamaterial mode of interest allows for the rapid swapping of excitations between qubits and metamaterial modes Conventional resonant structures in cQED are often formed from coplanar waveguides, which have a linear dispersion relation and thus a harmonic spectrum of standing-wave resonances. In contrast, superconducting metamaterials composed of lumped-element inductors and capacitors provide a route to implement microwave photonics with novel dispersion relations and dense mode spectra that can be coupled to qubits. Metamaterial lattices with qubits coupled to different unit cells in the metamaterial allow each qubit to couple strongly to modes with an antinode at the qubit location. Through simultaneous driving of appropriate combinations of modes, it is possible to produce large amplitudes at only one or a few unit cells, resulting in large ac Stark shifts of any qubits located there. This approach allows for a frequency-addressable qubit array without the need for flux-tunability and with greatly reduced requirements on the control wiring.

BRIEF DESCRIPTION OF THE SEVERAL VIEWS OF THE DRAWING(S)

The present invention will be more fully understood and appreciated by reading the following Detailed Description in conjunction with the accompanying drawings, in which.

Figure 3:
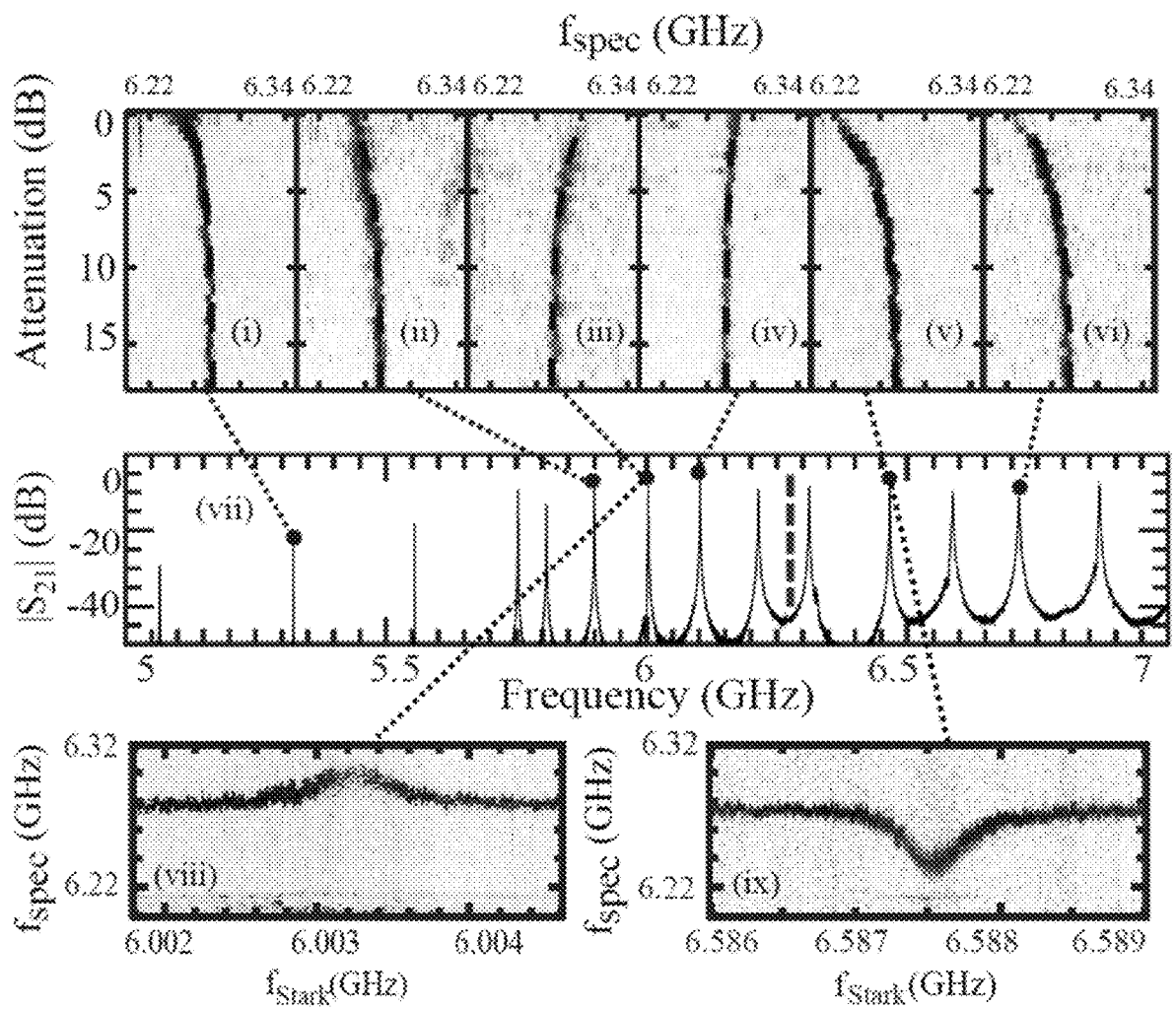

FIG. 3 is a series of graphs of the Stark shifts of qubit transition (i-vi) along with the Stark shift vs. power for unshifted qubit transition at 6.275 GHz for different levels of attenuation on microwave drive of different modes of metamaterial, as indicated in (vii), and (viii-ix) the Stark shift of same qubit transition for fixed microwave power while sweeping microwave frequency driven through metamaterial for two different modes.

Figure 4:
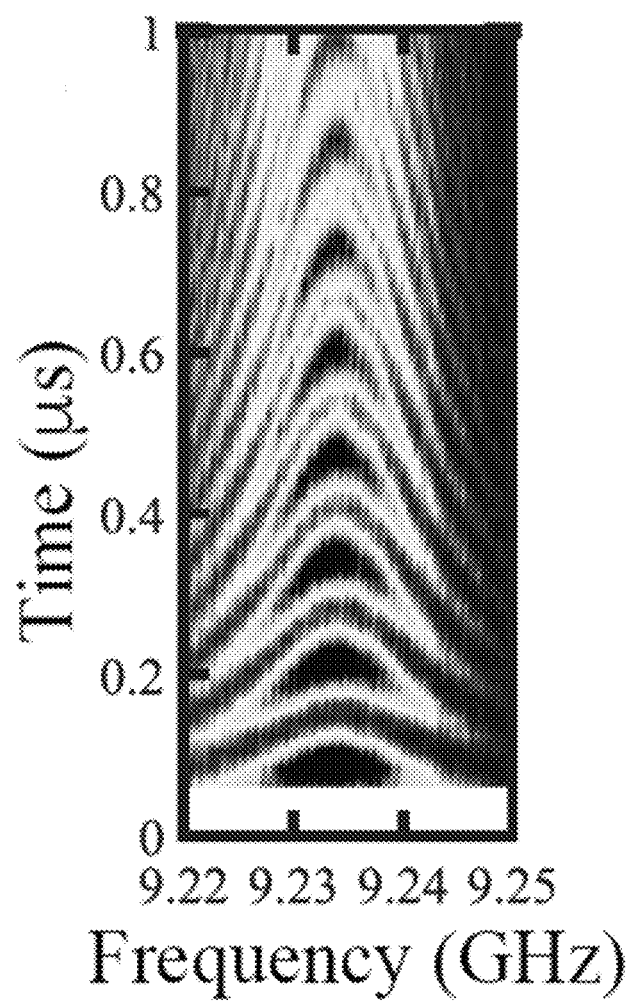

FIG. 4 is a graph of qubit Rabi oscillations for a qubit coupled to a metamaterial resonator.

Figure 5:
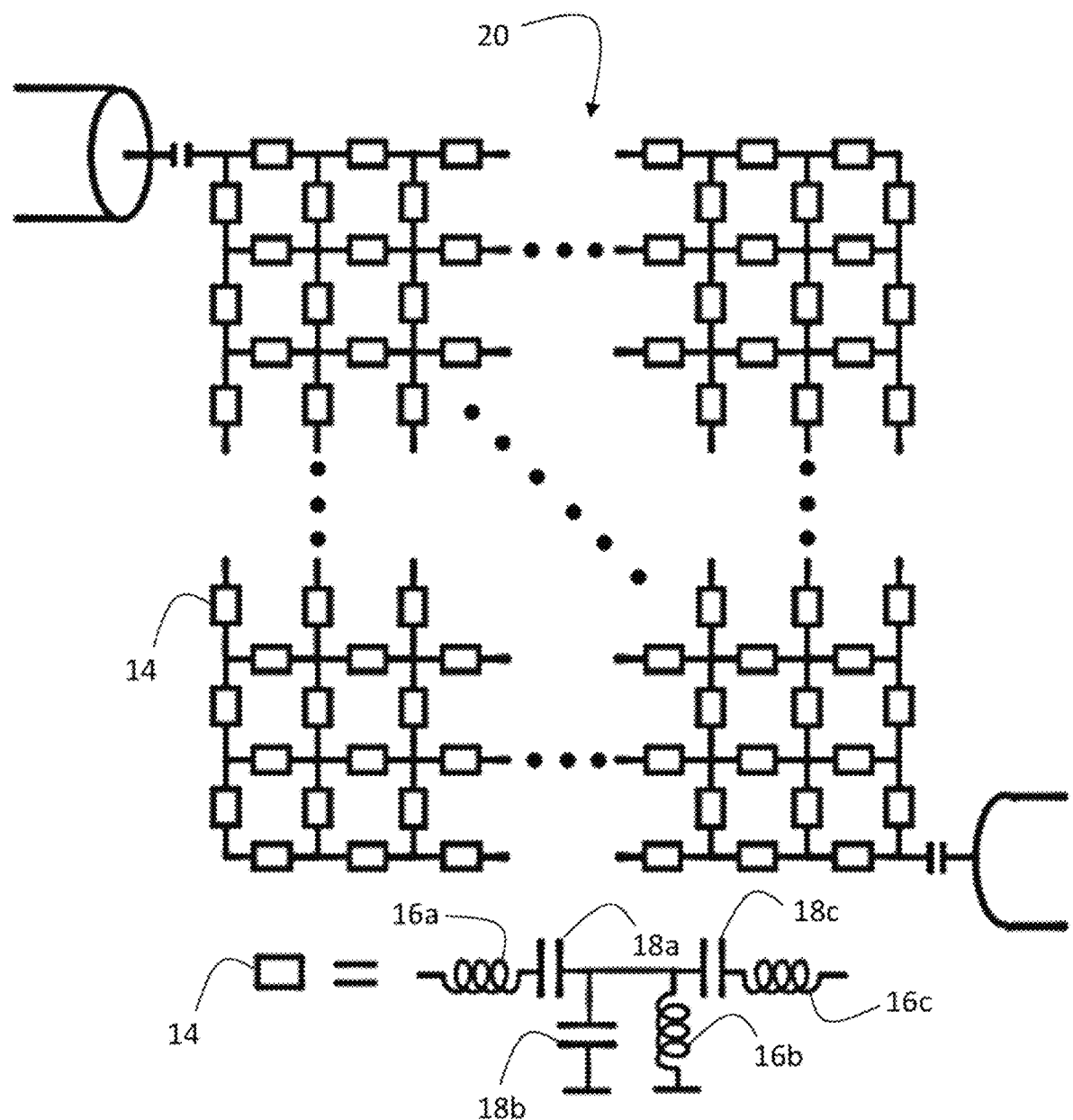

FIG. 5 is a schematic of two dimensional metamaterial according to the present invention.

Figure 6:
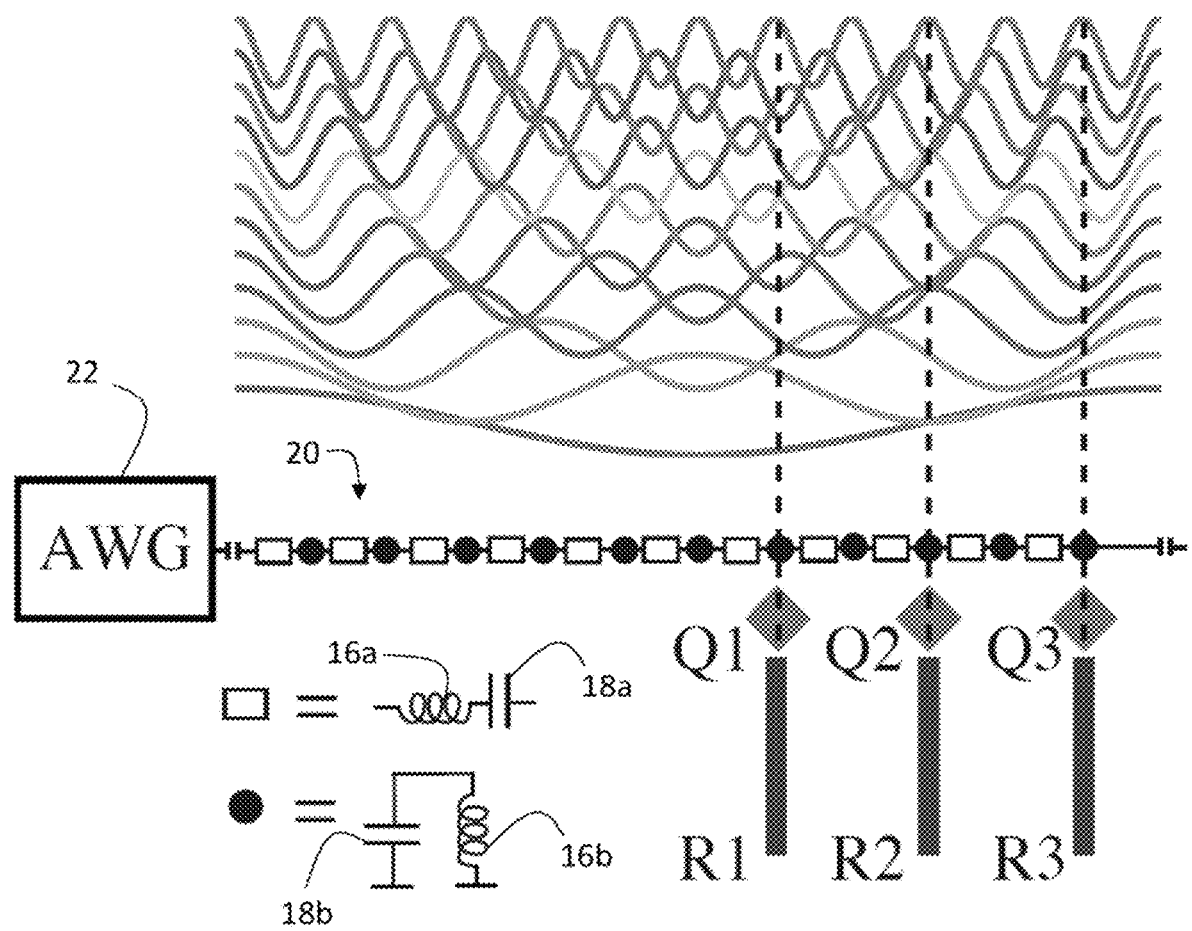

FIG. 6 is a schematic illustrating the coupling of multiple qubits to a one dimensional portion of a lattice along with a single arbitrary waveform generator that can selectively address each of the qubits.

Figure 7:
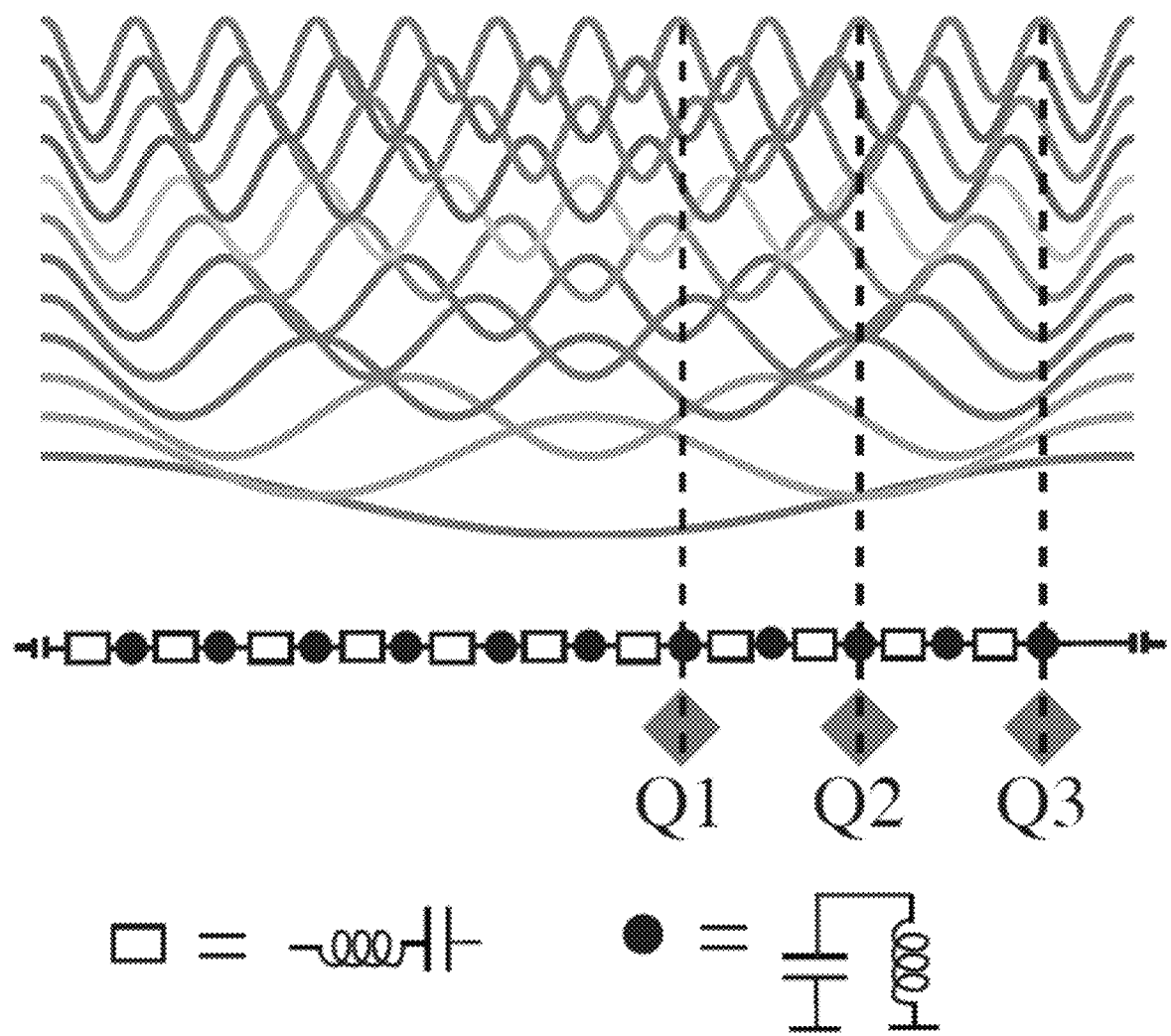

FIG. 7 is a schematic of schematic of an 11-cell 1D metamaterial and 3 qubits (Q1, Q2, Q3) with $V^2$ curves for corresponding standing waves.

Figure 8:
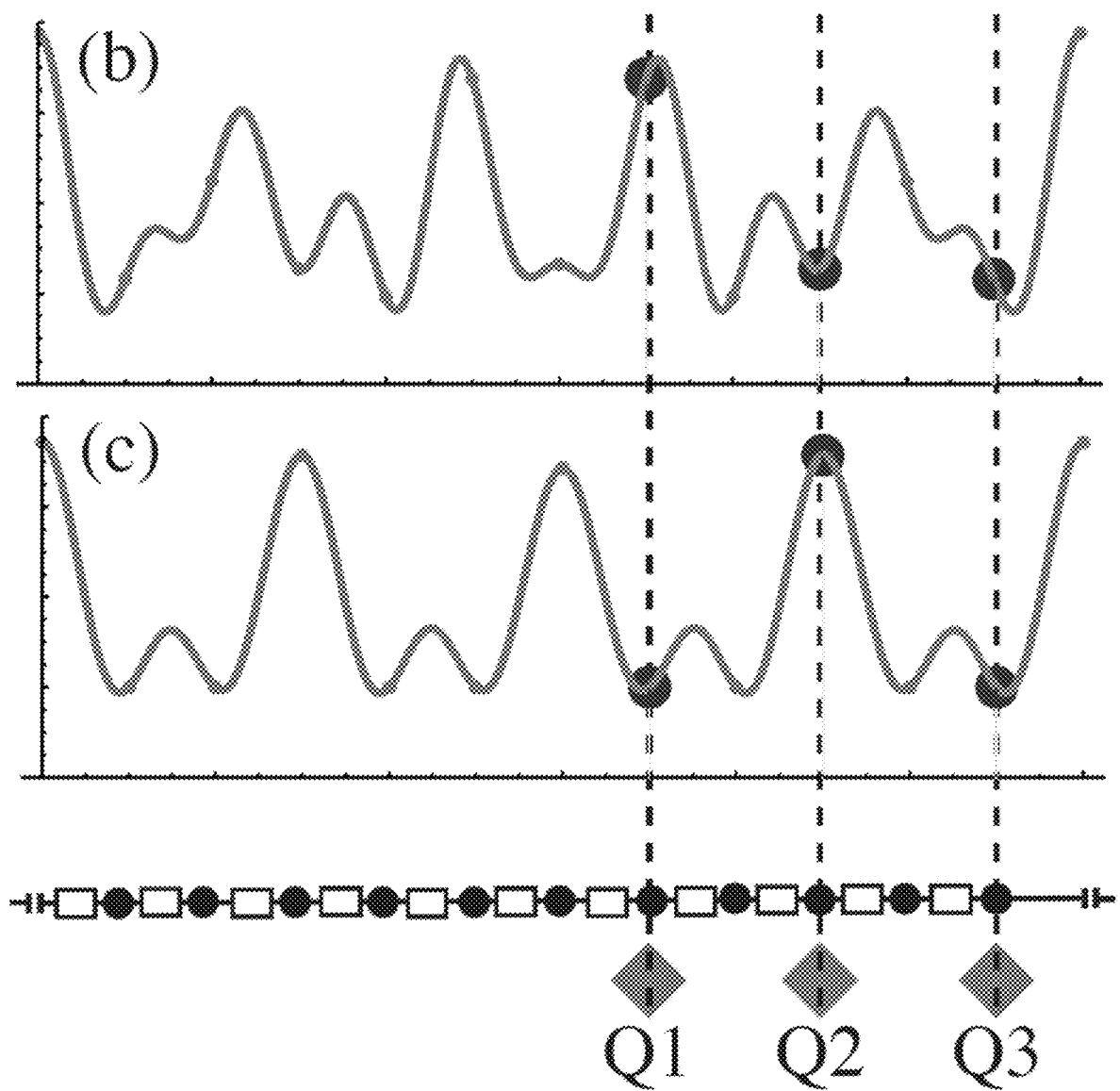

FIG. 8 is a graph of numerically simulated standing-wave patterns for multi-mode driving to optimize Stark shift for addressing Q1 (panel b) and Q2 (panel c).

Figure 9:
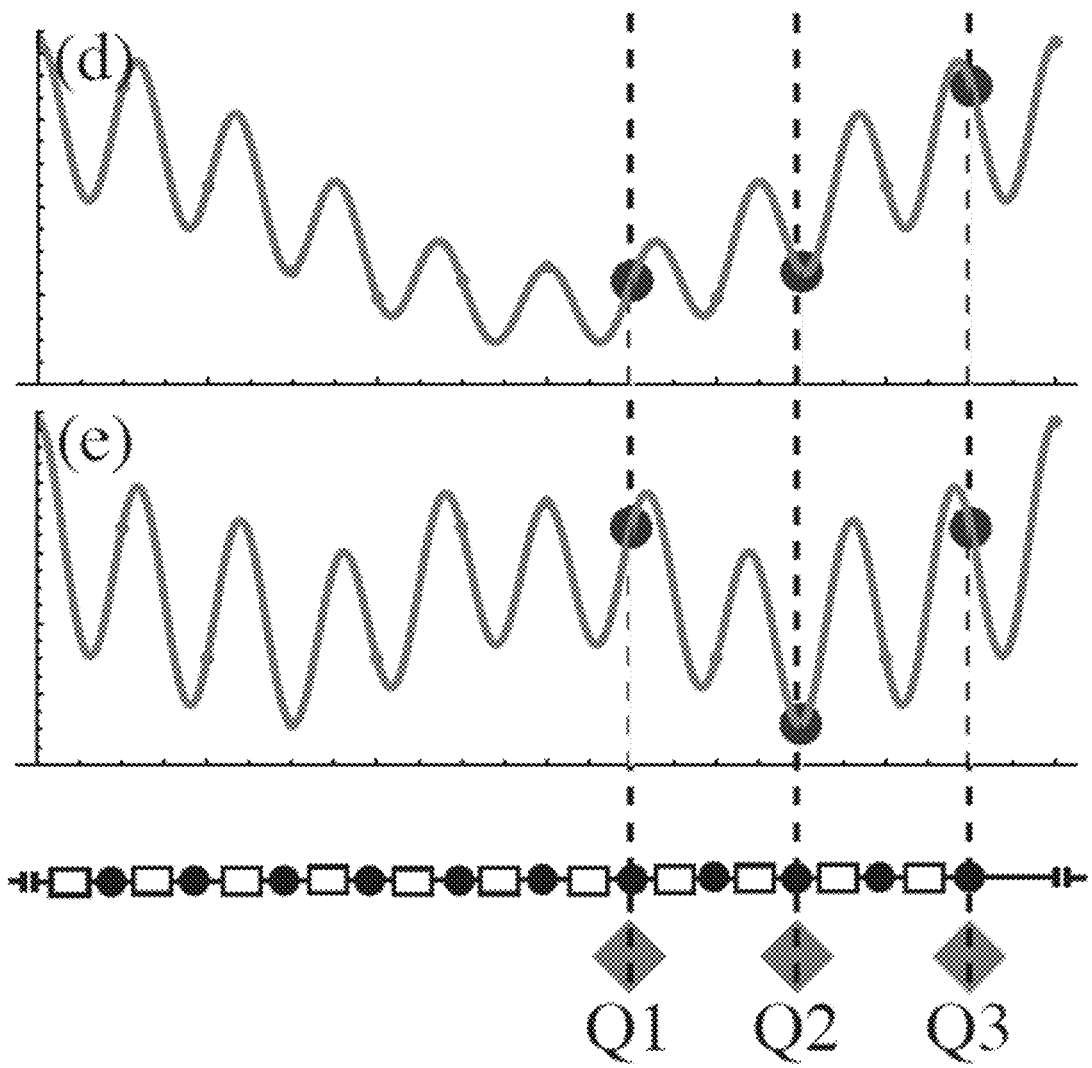

FIG. 9 is a graph of numerically simulated standing-wave patterns for multi-mode driving to optimize Stark shift for addressing Q3 (panel d) and Q1 and Q3 (panel e).

Figure 10:
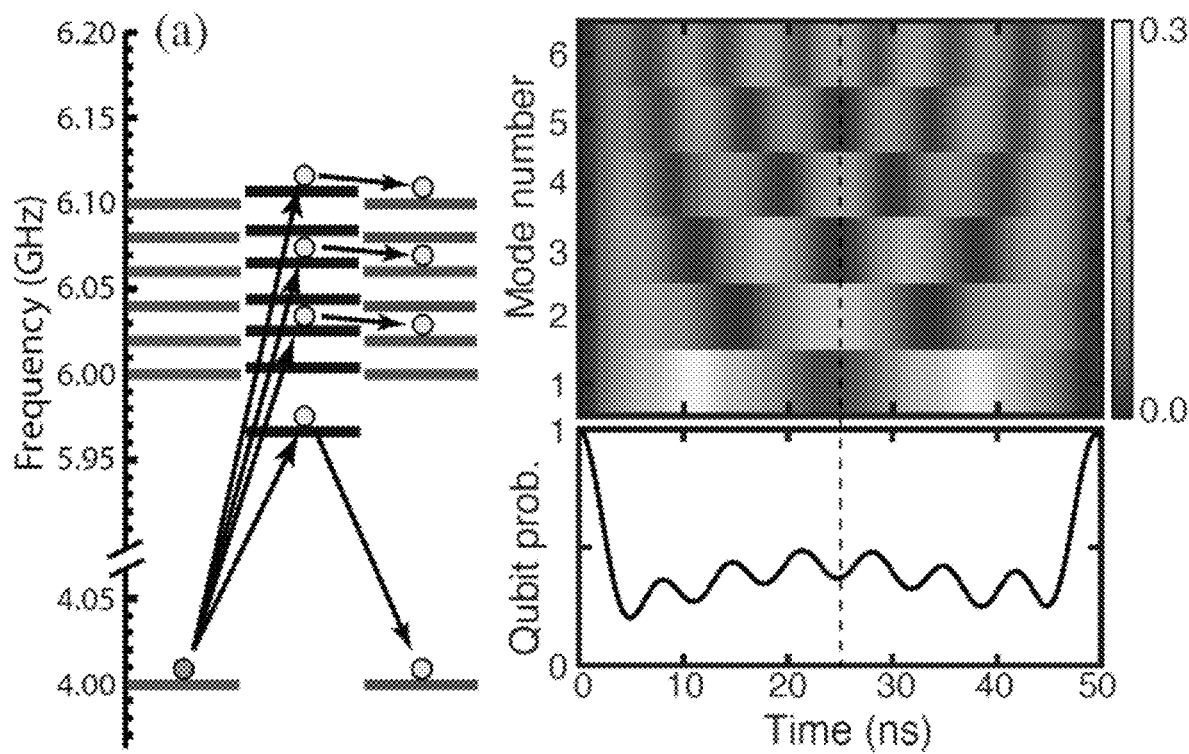

FIG. 10 is a simulation of quantum walk dynamics for 6-mode system plus qubit where an energy-level schematic shows levels before and after shift from qubit along with trajectory of excitations at time indicated by the dashed line alongside a density plot of photon occupation in modes and qubit excited state probability vs. time, where the Qubit is initially in excited state with all modes in vacuum.

Figure 11:
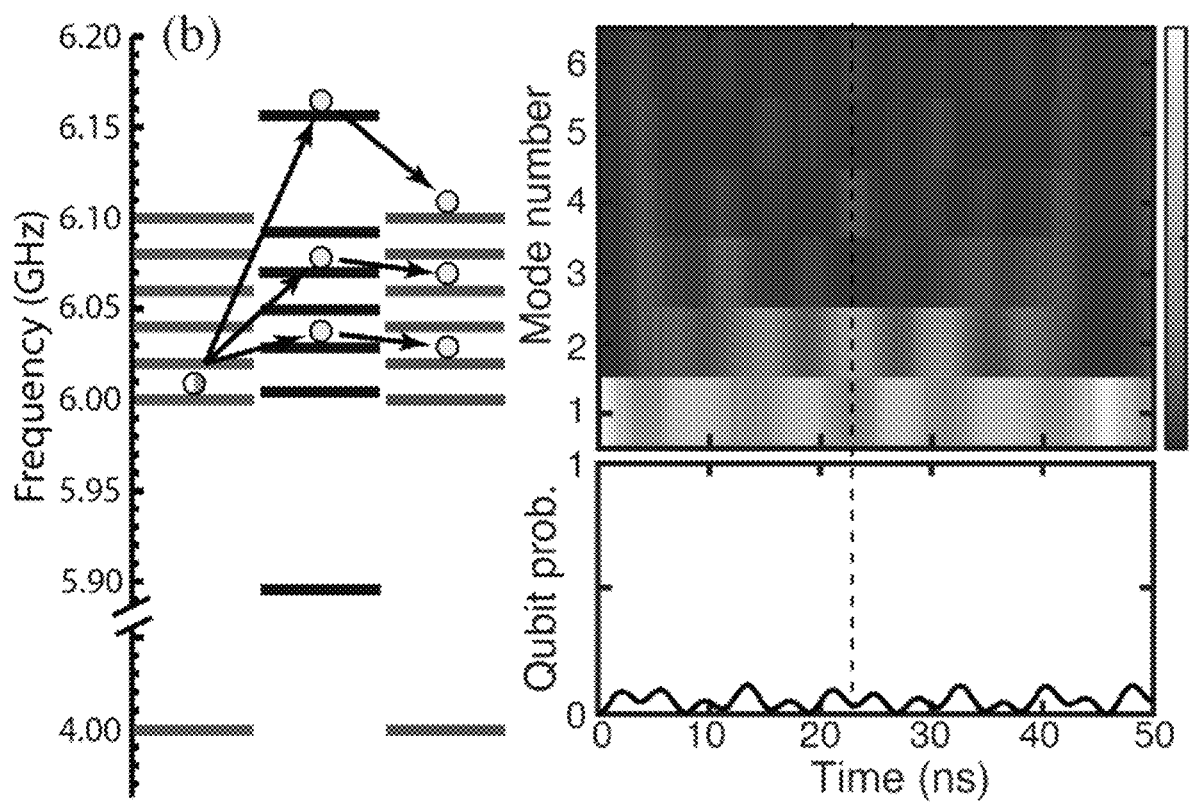

FIG. 11 is a simulation of quantum walk dynamics for 6-mode system plus qubit where an energy-level schematic shows levels before and after shift from qubit along with trajectory of excitations at time indicated by the dashed line along side a density plot of photon occupation in modes and qubit excited state probability vs. time, where the qubit is initially in ground state with mode 1 in 50/50 superposition of 1 photon and vacuum.

DETAILED DESCRIPTION OF THE INVENTION

Figure 1:
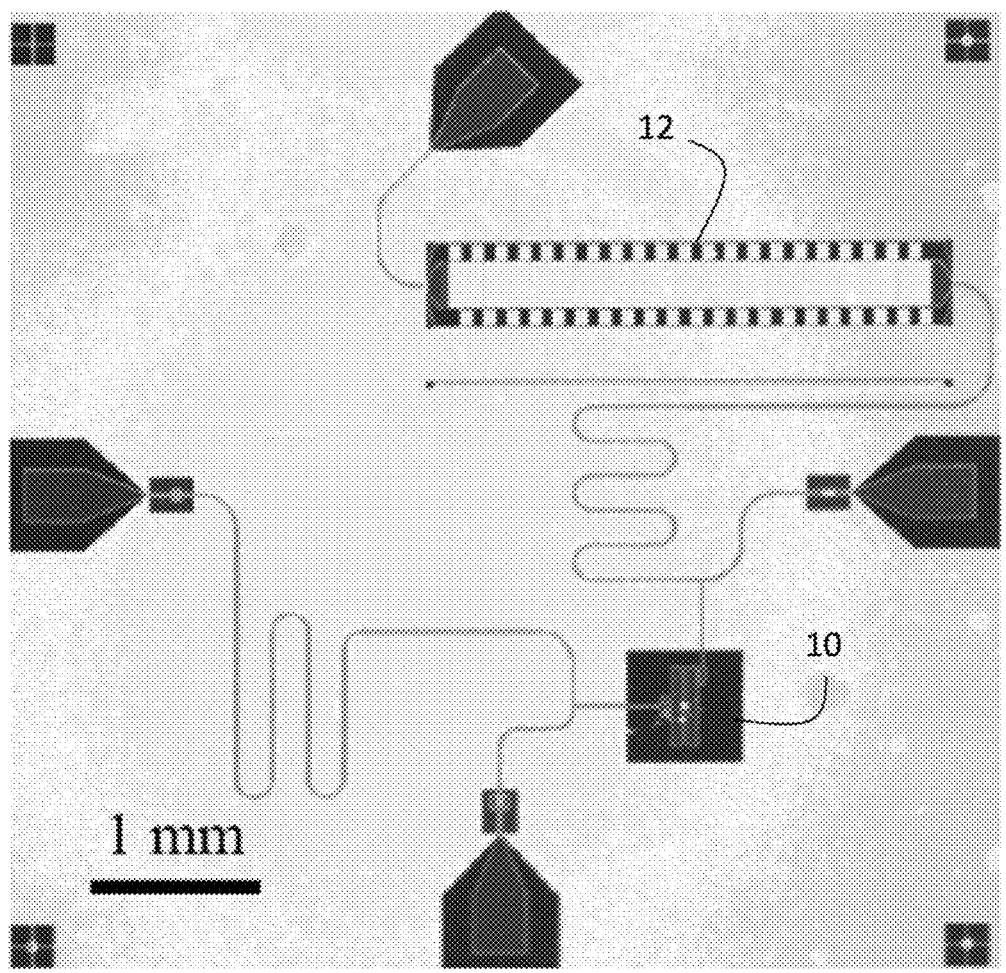
FIG. 1 is an optical micrograph of transmon qubit coupled to superconducting metamaterial resonator.

Referring to the figures, wherein like numeral refer to like parts throughout, there is seen in FIG. 1 a conventional qubit 10 coupled to superconducting metamaterial resonator 12. By capacitively coupling tunable transmon qubit 10 near a voltage antinode and a distributed transmission-line attached to the end of metamaterial 12, it is possible to couple the qubit to many modes simultaneously. A device according to this design has been measured around 25 mK on a dilution refrigerator and vacuum Rabi splittings have been observed in the transmission spectra of several of the metamaterial modes vs. magnetic flux as the bare transition energy of the qubit was tuned through resonance with the various electromagnetic modes. While the splittings were always smaller than the intermode spacing, numerically it is possible to reach the superstrong coupling regime, where the coupling strength between the qubit and metamaterial modes exceeds the separation between the modes.

Figure 2:
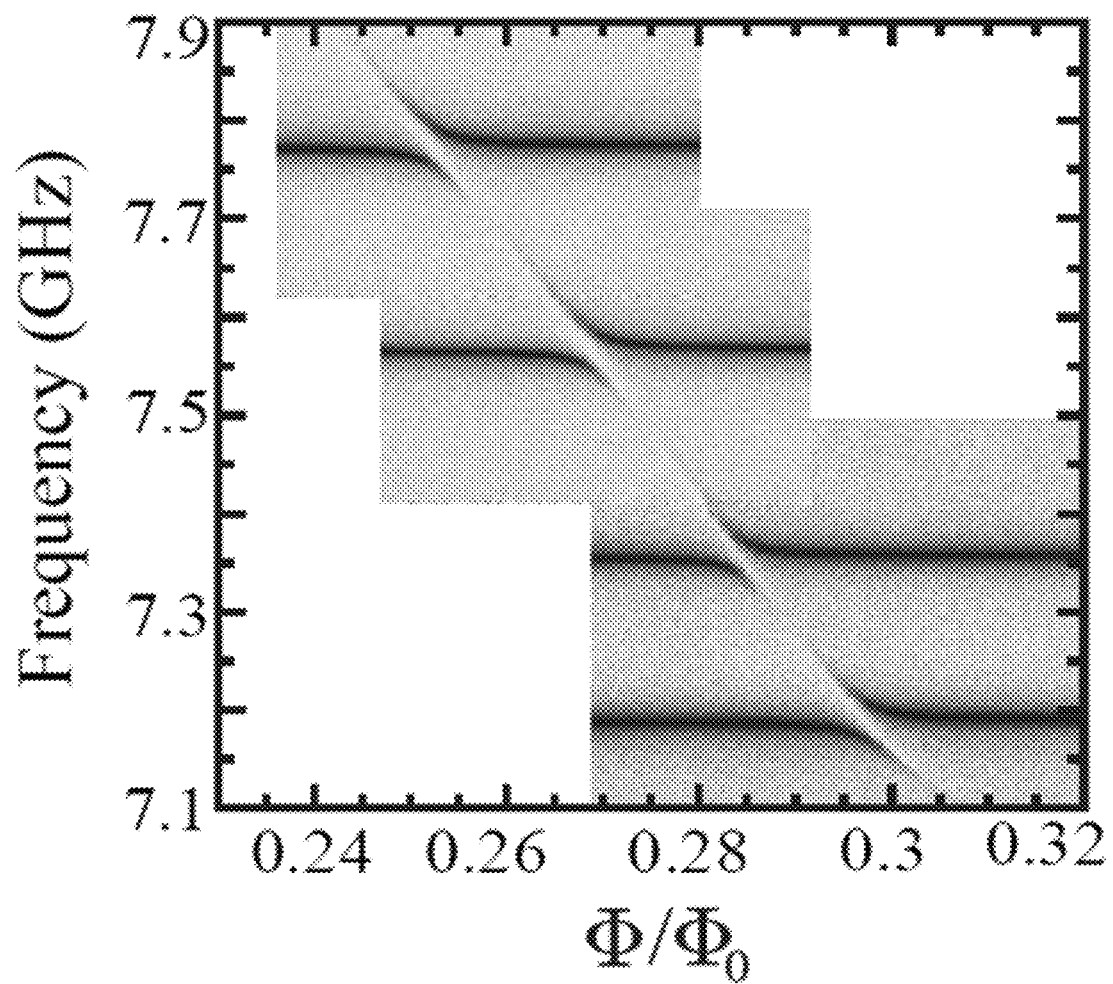
FIG. 2 is a density plot of magnitude of transmission through metamaterial resonator vs. qubit flux bias over span containing four metamaterial resonances according to the present invention.

By reading out the qubit state through a separate conventional right-handed resonator on the same chip, it is possible to map out variations in the qubit relaxation time $T_1$ as the qubit frequency is tuned through the forest of metamaterial modes. Below $f_{IR}$, which is the cutoff frequency below which the metamaterial does not support propagating modes, the $T_1$ times are above 10 μs, while at higher frequencies, there is a significant drop in $T_1$ each time the qubit frequency approaches one of the metamaterial resonances. This is consistent with a model based on the multi-mode Purcell effect between the qubit and the metamaterial. In this case, the suppression of $T_1$ when the qubit approaches resonance with any of the modes can be mitigated by weakening the coupling between the ends of the metamaterial and external circuitry, which will be entirely feasible devices according to the present invention. With the ability to read out the qubit state through the separate right-handed resonator, it is possible to observe ac Stark shifts of the qubit transition while simultaneously driving different modes of metamaterial 12. In cQED, the dispersive interaction between the qubit and resonator results in a shift of the resonator frequency that depends on the qubit state, which is the basis for most superconducting qubit measurement schemes. This same interaction also leads to an ac Stark shift of the qubit transition frequency that is proportional to the mean number of microwave photons in the resonator, which itself is proportional to the square of the local voltage in the resonator at the qubit location. In the present metamaterial system, it is possible to tune the qubit bias to fix its bare transition frequency, for example, at 6.275 GHz as seen in FIG. 2 in FIG. 3(c), then drive a separate microwave tone into the metamaterial at various resonant frequencies. This results in Stark shifts that depend on the number of photons in the particular mode, the detuning between the qubit and the mode being driven, and the anharmonicity of the qubit, which causes the change of sign for the shift for two of the modes. The ability to use the metamaterial to generate Stark shifts of the qubit frequency plays a critical role in selective qubit addressability.

Referring to FIG. 5, 2D superconducting metamaterials may be used to develop a N×N lattice 20 where the boundary conditions will result in $N^2$ modes between $f_{IR}$ and $f_{UV}$, which is the upper cutoff corresponding to the highest frequency left-handed mode of the metamaterial, thus producing an even denser microwave spectrum compared to the 1D case. Such structures may be fabricated in a cQED architecture capable of coupling to qubits. Lattice 20 is formed by a two-dimensional array of units 14, each of which is formed by, as an example, a first inductor 16a in series with a first capacitor 18a that is coupled to second capacitor 18b in parallel with a second inductor 16b, and in series to a third capacitor 18c and third inductor 16c.

Referring to FIG. 6, a plurality of qubits (Q1, Q2, Q3) may be coupled to lattice 20 and controlled via frequency-selective qubit addressing when collectively coupled to a commercially available, high-bandwidth arbitrary waveform generator (AWG) 22 and corresponding readout resonators (R1, R2, R3). AWG 22 is used to synthesize the appropriate combination of frequencies and amplitudes for a driving signal that generate a large waveform at the location of a particular qubit or pair of qubits (Q1, Q2, Q3). Because each qubit (Q1, Q2, Q3) is individually responsive to a particular combination of frequencies as seen in the exemplary waveforms of FIG. 6, those frequency combinations can be used to individually address each qubit (Q1, Q2, Q3) from a single AWG 22. The readout of each qubit (Q1, Q2, Q3) may be performed using standard dispersive measurement techniques from the field of circuit quantum electrodynamics (cQED). The present invention is illustrated with three qubits, which is the smallest non-trivial set of qubits, but could be easily extended to a much larger number of qubits.

Initial circuit simulations using AWR Microwave Office of such 2D metamaterials demonstrated the dense mode spectrum In addition, simulations have been generated of the standing-wave voltage patterns when different resonances are excited, which are now similar to 2D mechanical resonances, such as the vibration of a drumhead. A good electrical ground for the interior unit cells may be accomplished by jumper wirebonds to the ground plane beyond the lattice. However, for larger arrays, a multi-chip configuration with superconducting indium bump bonds between the ground points of the interior cells and a separate ground plane on a second chip that is flip-chip bonded to the chip with the metamaterial may be employed.

Superconducting metamaterials composed of lumped-element inductors and capacitors offer a route to create dense mode spectra with novel dispersion relations in a frequency range compatible with transmon qubits. The spectra can include bandgaps, where qubit lifetimes can be long, and transmission bands with left-handed dispersion where the mode frequency is a falling function of the wavenumber. With 2D metamaterial lattices such as that seen in FIG. 5, even more modes can be compressed into a narrow frequency band with a compact footprint. It is thus possible to reach the superstrong coupling regime, where the coupling strength between the qubit and metamaterial modes exceeds the separation between the modes. Using this scheme, it will be possible to implement quantum walk simulations for solving classically hard problems with significantly better scaling properties compared to current quantum simulation arrays.

Numerical simulations in QuTiP of a system with six closely spaced resonant modes were used to model the metamaterial resonances, with each mode coupled to a single, common qubit, which can either be biased far away from the modes, such that the modes are nearly linear and independent, or biased close to the modes, where the strong qubit-mode interactions shift the mode frequencies and make them nonlinear, as seen in FIG. 7 and FIG. 8, such that the modes interact with one another and can exchange photons.

2D metamaterial lattices may be used for implementing a disruptive approach to qubit addressability in large arrays with each qubit embedded in a particular unit cell of the metamaterial. The ability to shift the qubit frequency by hundreds of MHz through the ac Stark shift by driving a particular metamaterial mode that couples to the qubit has been demonstrated. With qubits located in the metamaterial lattice, a given qubit will only couple to modes that have an antinode near the unit cell containing the qubit. Populating photons in a mode that has a voltage node at the qubit location won't cause any Stark shift for that qubit, while photons in a mode with an antinode at the unit cell with the qubit will generate a large Stark shift. With a multi-frequency drive signal, it will be possible to excite combinations of standing-wave modes in the metamaterial lattice that will result in large voltage amplitudes at just one or a few lattice sites and thus Stark-shift the qubits at those particular sites with minimal perturbation of the others. A separate layer of control lines that run along one direction of the array on a separate chip that is bump-bonded to the metamaterial chip could deliver microwave control pulses that would only be resonant with the Stark-shifted qubits and thus implement a frequency-addressable gate scheme. Since no flux-bias control lines would be needed, this scheme only requires at most/N leads for an N-qubit array, which is dramatically better than the ≠aN scaling (a>1) for the current state of the art.

FIG. 7 illustrates this concept with an 11-cell 1D metamaterial resonator plus 3 qubits coupled to different unit cells in the right half of the array. As described previously, the resonator will support standing waves that are multiples of half of a wavelength; the square of the voltage profile determines the photon number and the related qubit Stark shift for a given mode. By exciting only certain modes with appropriate relative amplitudes, it is possible to generate non-sinusoidal standing-wave patterns with large displacements at some locations and small displacements at others. In FIGS. 10 and 11, the results of a simple Mathematica calculation are shown for this 11-cell/3-qubit example for the optimum driving combinations for selectively addressing each of the 3 qubits while minimally displacing the other 2. It is also possible to choose driving combinations that result in large Stark shifts for 2 of the qubits, but not for the third qubit of FIG. 9, panel (e), thus raising the possibility of selectively addressed two-qubit gates, potentially even between non-nearest neighbor qubits. Synthesis of the multi-frequency waveforms for driving the metamaterial is straightforward with room-temperature microwave synthesizers and one can precompute the necessary frequency components for addressing each lattice site.

The nature of the standing waves restricts the patterns to cosines rather than sines, thus there is no ability to adjust the spatial phase of the waveform. In addition, all of the coefficients in the expansion are confined to be positive and real, thus every lattice site will always have some non-zero amplitude. Nonetheless, despite these restrictions, this scheme is still remarkably flexible for selectively addressing qubits. The upshot of these limitations compared to conventional Fourier expansions is that completely arbitrary patterns are not possible and one requires more metamaterial lattice sites than qubits in the array. Because the patterns always have inversion symmetry about the middle of the array, it is not possible to selectively address two qubits on either half of the array that are the same distance from the center. Thus, the array must be at least twice as long as the number of qubits. In addition, adding even more cells in the array introduces shorter wavelength modes to give better addressability. Based on initial numerical investigations, it appears that having a metamaterial lattice with the number of cells being four times the number of qubits results in displacements of the target qubit at least three times larger than for the other qubits.

While the example in FIG. 7 is a 1D lattice, this scheme can be directly extended to 2D using the same 2D metamaterial lattices described above. In this case, the driving waveforms will excite combinations of 2D standing-wave patterns, rather than simple cosines, as in the 1D case, but the concept and result will be the same. For a 10×10 qubit array, one would need a 40×40 metamaterial lattice, which would still fit within an entirely reasonable footprint of a few mm on a side. The dramatic advantage would arise in the number of leads required for addressing the qubits—instead of 100 flux-bias leads to address each qubit individually, as in a conventional superconducting qubit array, one would only need one lead to deliver the multi-frequency waveform for selectively addressing each of the qubits. The limit on the number of lattice sites that could be addressed by a single drive line would be set by the linewidths of the individual metamaterial resonances. Using a crude estimate of 0.5 MHz for the linewidth of each mode and a 5 GHz bandwidth between $f_{IR}$ and $f_{UV}$, a single line could be used to address 5000 qubits. For larger qubit lattices, it would be possible to use multiple metamaterial lattices, each with its own drive line, for different portions of the qubit array.

While the scaling requirements for the leads required to address each qubit with this scheme are dramatically better than for conventional qubit approaches, the number of x/y-control lines needed to implement qubit gates could also be significantly reduced, although somewhat more modestly. Instead of requiring one x/y-control line per qubit, as in conventional architectures, the selective addressability with metamaterials would allow for parallel microwave rails along one axis of the lattice to carry microwave signals for driving gates for any qubits in that particular row that are selected with an appropriate Stark shift. Thus, the number of x/y-control lines for an N-qubit system would be $\sqrt{N}$ rather than N. Combining this scaling with the values for the address lines, a conventional qubit architecture with 1,000,000 qubits would require 2,000,000 address and control lines, while the metamaterial scheme of the present invention would need roughly 1200 lines, which would be exceedingly more manageable for accommodating on a large dilution refrigerator and room-temperature electronics rack. By developing compact, parallel-plate capacitors and a crossover wiring scheme for allowing traces from different lumped-elements to cross while remaining electrically isolated, it is possible to explore metamaterial lattices in greater than 2D that are embedded in planar structures on a chip.

An approach such as that seen in FIGS. 10 and 11 may be used to more efficiently perform operations, such as a quantum walk, using the present invention. A quantum walk may proceed in 3 stages: (1) in order to load an initial state of photons in different modes, the approach starts with the qubit far detuned, then either excite the qubit with a π-pulse or apply parametric modulation of the qubit at sideband frequencies to particular modes in order to prepare complex initial photonic states of the metamaterial modes and qubit, and these could include superposition states within a single mode and between modes; (2) the quantum walk is then initiated by abruptly tuning the strongly coupled qubit from far off resonance with the modes to being nearly resonant with the modes hosting the initial photonic state. The qubit nonlinearity will strongly mix the modes and thus greatly enhance the probabilities for photons to hop between modes and thus undergo a quantum walk in frequency space; these hopping probabilities J, which allow one to define the nature of the particular quantum walk being implemented, could be tuned by changing the qubit bias point during the strong interaction phase; (3) following the desired evolution time for the walk, the qubit could be biased back to its starting point far detuned from the modes, thus restoring linearity to the modes and making them independent again, such that the final state of the quantum walk becomes frozen in the frequency lattice. In order to measure this final state, the original qubit could be used to probe the photon occupation probability in each of the modes, either by repeated sideband parametric modulation of the qubit or detection of the photon-number-dependent Stark shift of the qubit transition. FIGS. 10 and 11 contain two examples of these quantum walk simulations for two different initial photon states in the frequency lattice. Of course, these initial simulations with 6 modes and 1 qubit are possible on a desktop computer, but adding just a modest number of modes to the quantum walk causes the computational requirements to diverge exponentially, thus further motivating the hardware implementation of these quantum walks with metamaterials.

The dense mode spectrum of superconducting metamaterial resonators makes them an ideal match for this approach to quantum walks. Following this scheme, with just one qubit, one could implement a quantum walk of microwave photons with at least tens of lattice sites in frequency space, while only requiring control and readout connections for the one qubit. Hopping probabilities could be adjusted in situ by varying the detuning between the qubit and the modes during the walk. By moving to a 2D metamaterial, but still with just one or a few qubits, the quantum walk can be extended by easily an order of magnitude more lattice sites with no extra leads required, due to the even denser spectrum for higher-dimensional metamaterial lattices. The approach of the present invention thus allows for the exploration of the fundamental quantum walk dynamics of complex microwave photon states through frequency space, including the role of entanglement between photons undergoing the walk. With the present invention, it is possible to implement quantum walk simulations for solving classically hard problems with significantly better scaling properties compared to current quantum simulation arrays.

The present invention thus includes the use of metamaterials to implement quantum walks in the frequency domain, and the development of qubit lattices embedded in metamaterials for multi-frequency driving of selective qubit Stark shifts.

What is claimed is:

1. A quantum circuit, comprising:
   a plurality of lumped-element inductors and a plurality of lumped-element capacitors formed from a superconducting metamaterial, wherein the plurality of lumped-element inductors and the plurality of lumped-element capacitors are configured as a plurality of unit cells arranged in a lattice;
   a series of superconducting qubits embedded in the lattice, wherein each of the series of superconducting qubits is coupled to a different one of the plurality of unit cells of the lattice so that each of the series of superconducting qubits is individually addressable using one of a combination of metamaterial modes that will generate a Stark shift of a transition frequency of that superconducting qubit; and
   a high-bandwidth arbitrary waveform generator coupled to the lattice and configured to selectively drive the combination of metamaterial modes and generate the Stark shift of the transition frequency of one of more of the series of superconducting qubits.

2. The quantum circuit of claim 1, further comprises a series of readout resonators, each of which is coupled to a corresponding one of the series of superconducting qubits.

3. The quantum circuit of claim 2, wherein each unit cell of the two dimensional lattice comprises a first inductor and a second capacitor coupled in series, a second inductor and a second capacitor coupled in parallel, and a third capacitor and third inductor coupled in series.

4. The quantum circuit of claim 3, wherein the lattice is a two dimensional lattice.

5. A method of forming a quantum circuit, comprising:
   arranging a plurality of lumped-element inductors and a plurality of lumped-element capacitors formed from a superconducting metamaterial as a plurality of unit cells arranged in a lattice;
   coupling each of a series of superconducting qubits to a different one of the plurality of unit cells of the lattice so that each of the series of superconducting qubits is individually addressable using one of a combination of metamaterial modes that will generate a Stark shift of a transition frequency of that superconducting qubit;
   coupling a high-bandwidth arbitrary waveform generator coupled to the lattice; and
   using the high-bandwidth arbitrary waveform generator to selectively drive the combination of metamaterial modes and generate the Stark shift of the transition frequency of one or more of the series of superconducting qubits.

6. The method of claim 5, wherein the lattice incudes a series of readout resonators, each of which is coupled to a corresponding one of the series of superconducting qubits.

7. The method of claim 6, wherein each unit cell of the lattice comprises a first inductor and a second capacitor coupled in series and a second inductor and a second capacitor coupled in parallel, and a third capacitor and third inductor coupled in series.

8. The method of claim 7, wherein the lattice is a two dimensional lattice.

* * * * *